(12) United States Patent
Chojecki et al.

(10) Patent No.: US 8,283,808 B2
(45) Date of Patent: Oct. 9, 2012

(54) SWITCH ARRANGEMENT AND METHOD FOR ELECTRICAL SWITCHING

(75) Inventors: Pawel Chojecki, Graz (AT); Jeffrey Smith, Graz (AT)

(73) Assignee: Austriamicrosystems AG, Unterpremstatten (AT)

( * ) Notice: Subject to any disclaimer, the term of this patent is extended or adjusted under 35 U.S.C. 154(b) by 240 days.

(21) Appl. No.: 12/374,647

(22) PCT Filed: Jul. 19, 2007

(86) PCT No.: PCT/EP2007/057482
§ 371 (c)(1),
(2), (4) Date: Aug. 14, 2009

(87) PCT Pub. No.: WO2008/009726
PCT Pub. Date: Jan. 24, 2008

(65) Prior Publication Data
US 2010/0007216 A1   Jan. 14, 2010

(30) Foreign Application Priority Data

Jul. 21, 2006 (EP) .................................... 06015236

(51) Int. Cl.
*H01H 19/14* (2006.01)
(52) U.S. Cl. ............................ 307/115; 361/58; 327/110
(58) Field of Classification Search .................. 307/115; 361/58; 363/48

See application file for complete search history.

(56) References Cited

U.S. PATENT DOCUMENTS

| 7,071,740 B2 * | 7/2006 | Adams et al. ................. 327/110 |
| 7,266,000 B2 * | 9/2007 | Terdan ............................. 363/48 |
| 7,339,773 B2 * | 3/2008 | Gergintschew ................. 361/58 |
| 2001/0026429 A1 | 10/2001 | Fukuda et al. |
| 2005/0013076 A1 | 1/2005 | Sverev et al. |

FOREIGN PATENT DOCUMENTS

| EP | 1 347 576 | 9/2003 |
| WO | WO 2006/036963 | 4/2006 |

OTHER PUBLICATIONS

Paul Horowitz, The Art of Electronics, 2006, The Press Syndicate of the University of Cambridge, Second Edition, 229-230.*

* cited by examiner

*Primary Examiner* — Rexford Barnie
*Assistant Examiner* — Toan Vu
(74) *Attorney, Agent, or Firm* — Cozen O'Connor

(57) ABSTRACT

A switch arrangement comprises a first and a second terminal (1, 2), a first switch (3), a current sensor (10), a first and a second control circuitry (20, 30). The first switch (3) comprises a control terminal (4), a first terminal (5) which is coupled to the first terminal (1) of the switch arrangement and a second terminal (6) which is coupled to the second terminal (2) of the switch arrangement. The current sensor (10) is realized for the measurement of a load current (Iload) flowing through the first switch (3). The first control circuitry (20) is coupled to an output terminal of the current sensor (10) and to the control terminal (4) of the first switch (3). The second control circuitry (30) is coupled to the control terminal (4) of the first switch (3).

12 Claims, 2 Drawing Sheets

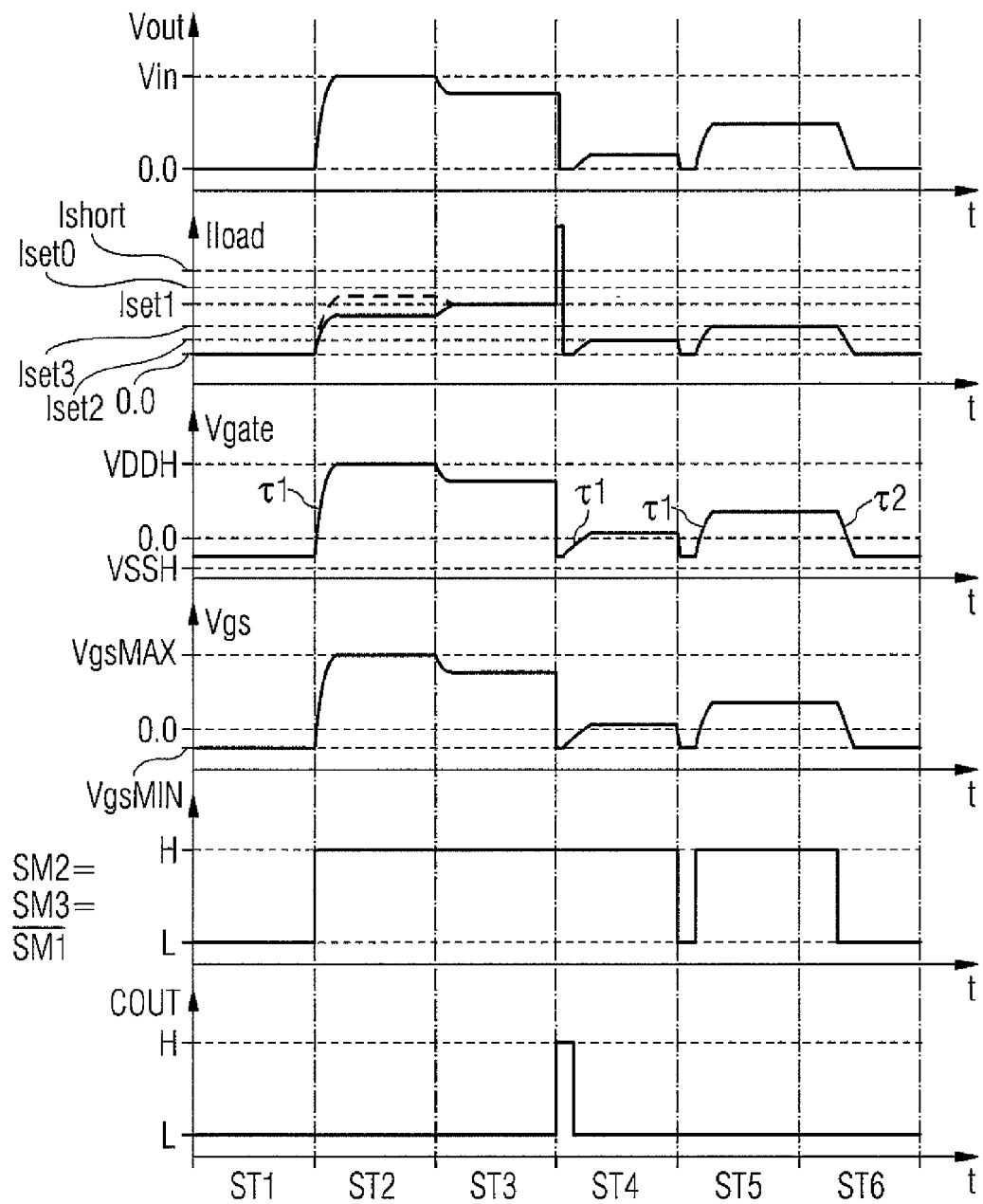

SWITCH ARRANGEMENT AND METHOD FOR ELECTRICAL SWITCHING

RELATED APPLICATIONS

This is a U.S. national stage under 35 USC §371 of application No. PCT/EP2007/057482, filed on Jul. 19, 2007.

This application claims the priority of European Patent Application 06015236.0 filed Jul. 21, 2006, the disclosure content of which is hereby incorporated by reference.

The present invention relates to a switch arrangement and a method for electrical switching.

BACKGROUND OF THE INVENTION

Switch arrangements can be used for connecting and disconnecting an electrical energy source and an electrical load. Because a relay can also fulfill the function of connecting and disconnecting two electrical circuits, a switch arrangement sometimes is called a solid state relay.

SUMMARY OF THE INVENTION

It is an object of the invention to provide a switch arrangement and a method for electrical switching with a high flexibility and a current limitation capability.

This object is solved by a switch arrangement comprising the features of claim 1 and by a method for electrical switching according to claim 13. Preferred embodiments are presented in the respective dependent claims.

A switch arrangement comprises a first and a second terminal, a first switch, a current sensor, a first control circuitry and a second control circuitry. The first switch comprises a control terminal and a first and a second terminal. The first terminal of the first switch is coupled to the first terminal of the switch arrangement. The second terminal of the first switch is coupled to the second terminal of the switch arrangement. The current sensor is connected in series to the first switch. The series circuit, comprising the first switch and the current sensor, is arranged between the first terminal and the second terminal of the switch arrangement.

The first and the second control circuitries are each coupled to the control terminal of the first switch. An output terminal of the current sensor is coupled to the first control circuitry.

A load current flows through the first and the second terminal of the switch arrangement and through the series circuit of the first switch and the current sensor. A signal comprising information about the load current is provided by the current sensor at the output terminal of the current sensor and is received by the first control circuitry. The first control circuitry applies a first signal to the control terminal of the first switch and the second control circuitry supplies a second signal to the control terminal of the first switch. The first signal depends on the load current. The second signal depends on a first mode signal for a first state of the switch arrangement.

It is an advantage of the switch arrangement comprising the current sensor that the first switch can be controlled using a direct information about the load current flowing through the switch. It is an advantage of the switch arrangement with the first control circuitry providing the first signal that the switch can be operated in an on-state or an off-state. Therefore, the load current can be limited. It is an advantage of the second control circuitry to which a first mode signal is provided that it allows a high flexibility in controlling the first switch.

In an embodiment, the first control circuitry is provided for current limitation of the load current by a first threshold signal. The current limitation is provided in such a way by the first control circuitry that the load current is smaller or is equal to the first threshold signal.

In an embodiment, the switch arrangement comprises a protection circuitry against short circuit. The protection circuitry is connected to the output terminal of the current sensor. Further on, the protection circuitry couples the control terminal of the first switch to a reference potential terminal. The protection circuitry advantageously provides a gate voltage to the control terminal of the first switch with a value so that the first switch is switched in an off-state.

In an embodiment, the current sensor is connected between the first switch and the second terminal. In a preferred embodiment, the current sensor is connected between the first terminal and the first switch.

The first and/or the second control circuitries can be realized as voltage sources. The first and/or the second control circuitries can preferably be realized as current sources.

In an embodiment, the first switch is realized as a bipolar transistor, comprising a base terminal as the control terminal. The first and the second control circuitries, therefore, can provide a base current to the base terminal by providing the first and the second signal in the form of a first and a second current signal.

In an alternative embodiment, the first switch is realized as a field-effect transistor, abbreviated FET. The first switch can be a P-channel field-effect transistor. In a preferred embodiment, the first switch is a N-channel field-effect transistor.

In an embodiment, the first switch is realized as a metal-oxide-semiconductor field-effect transistor, abbreviated MOSFET. In a preferred embodiment, the first switch is realized as a power MOSFET.

Field-effect transistors and especially MOSFETs comprise a gate capacitance between the control terminal and a controlled section of the transistor between the first and the second terminal of the first switch. An output circuit of the first switch comprises the controlled section. A gate voltage at the control terminal of the first switch is controlled by the first and the second signal circuitries. It is an advantage of this embodiment that the charge on the gate capacitance can be controlled exactly and, therefore, the first switch can be operated in an on-state or an off-state. In a preferred embodiment, the first switch can be operated in an on-state, an off-state or an intermediate-state as a controlled resistor.

The first and the second control circuitries, realized as voltage sources, can provide the first and the second signal in the form of a first and a second voltage signal to the gate capacitance and can charge and discharge the gate capacitance.

The first and the second control circuitries, realized as current sources, can provide the first and the second signal in the form of a first and a second current signal to the gate capacitance and can charge and discharge the gate capacitance. It is an advantage of this embodiment that the transitions between the different states can be exactly controlled.

In an embodiment, the first control circuitry provides the first signal in such a way that the load current is smaller or is equal to a first threshold signal. If the load current obtains a current value which is approximately the value of the first threshold signal, the resistance between the first and the second terminal of the first switch can be increased in such a way, that the load current is not increased above the first threshold signal. It is an advantage of a switch arrangement with such a current limitation capability, that a load has not to be disconnected from an energy source, if the load current rises to the value of the first threshold signal. The load has not to be completely switched off in case the load current obtains a value which is approximately equal to the first threshold signal.

In an embodiment, the switch arrangement is designed as a high side switch, so that the switch arrangement is arranged between the energy source and the load.

In an embodiment, the switch arrangement is designed as a bidirectional switch so that the load current can flow from the first terminal of the switch arrangement to the second terminal of the switch arrangement at a first point in time and from the second terminal to the first terminal at a second point in time.

In an embodiment, the first switch is realized using a first semiconductor body. The first and the second control circuitries are realized using a second semiconductor body which is coupled to the first semiconductor body. A measurement resistor of the current sensor can be coupled to the first and the second semiconductor body.

In a preferred embodiment, the switch arrangement including the first switch, the first and the second control circuitries is realized using a common semiconductor body. The measurement resistor of the current sensor can be separately realized and be coupled to the common semiconductor body.

According to an aspect of the invention, the method for electrical switching comprises the following steps: A controlling of a first switch is performed by providing a first signal and/or a second signal to a control terminal of the first switch. The first signal is generated depending on a load current which flows through the first switch. The second signal is provided depending on a first mode signal. It is an advantage of the method for electrical switching, that by the use of two signals the first switch can be operated in a flexible manner.

In an embodiment, the first signal is provided in such a way that the load current is smaller or is equal to a first threshold signal.

In an embodiment, a third signal is provided to the control terminal of the first switch for protection against short circuit. The third signal depends on the load current and a second threshold signal. The first threshold signal is advantageously smaller than the second threshold signal.

In a further development, the third signal can stop the load current in case the load current is higher than the second threshold signal.

In an embodiment, the second signal and the first signal are current signals. In a preferred embodiment, the sign of the first signal depends on the difference of the load current and a first threshold signal. If the load current is smaller than the first threshold signal, the first signal is generated with a positive value so that the first switch is operated in an on-state and obtains a low resistance. If the load current is greater than the first threshold signal, then the first signal obtains a negative value. If the load current is approximately equal to the first threshold signal, the first signal obtains a value of approximately 0.

BRIEF DESCRIPTION OF THE DRAWINGS

The following description of figures of exemplary embodiments may further illustrate and explain the invention.

FIG. 3 shows an exemplary embodiment of signals provided by the switch arrangement.

DETAILED DESCRIPTION OF THE DRAWINGS

Figure 1:
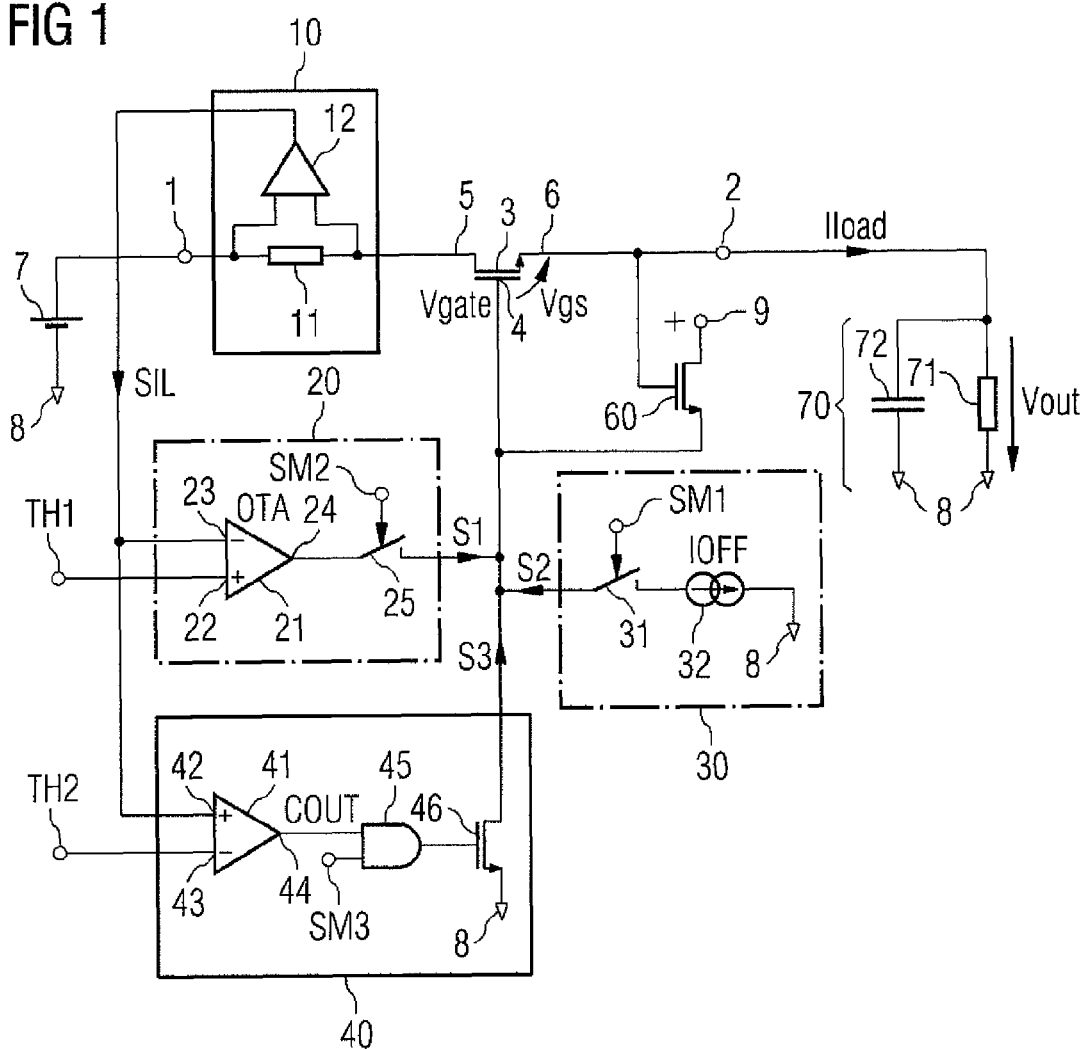
FIG. 1 shows a schematic of an exemplary embodiment of a switch arrangement.

FIG. 1 shows an exemplary embodiment of a switch arrangement. The switch arrangement comprises a first switch 3, a first terminal 1, a second terminal 2, a first control circuitry 20, a second control circuitry 30, a protection circuitry 40, a current sensor 10 and a first transistor 60. An electrical load 70 is connected to the second terminal 2 of the switch arrangement. The load 70 is represented by a resistor 71 and a capacitor 72 which are connected in parallel between the second terminal 2 of the switch arrangement and a reference potential terminal 8. An energy source 7 is connected to the first terminal 1 of the switch arrangement.

The first switch 3 comprises a first terminal 5 which is connected via the current sensor 10 to the first terminal 1 of the switch arrangement. The first switch 3 further comprises a second terminal 6 which is connected to the second terminal 2 of the switch arrangement.

The current sensor 10 comprises a measurement resistor 11 and an amplifier 12. The amplifier 12 has two input terminals which are connected to the two terminals of the measurement resistor 11. The amplifier 12 is realized as a differential amplifier. An output terminal of the amplifier 12 is connected to an output terminal of the current sensor 10 which is connected to the first control circuitry 20 and to the protection circuitry 40.

An output terminal of the first control circuitry 20, an output terminal of the second control circuitry 30 and an output terminal of the protection circuitry 40 are connected to the control terminal 4 of the first switch 3. The first control circuitry 20 comprises an operational transconductance amplifier 21, abbreviated OTA, and a second switch 25. The operational transconductance amplifier 21 comprises a first input terminal 22 and a second input terminal 23 which is connected to the output terminal of the current sensor 10. The operational transconductance amplifier 21 also comprises an output terminal 24 which is coupled to the output terminal of the first control circuitry 20 via the second switch 25.

The second control circuitry 30 comprises a current sink 32 and a third switch 31. The current sink 32 is connected to the reference potential terminal 8 and is coupled to the output terminal of the second control circuitry 30 via the third switch 31.

The protection circuitry 40 comprises a comparator 41, a logic gate 45 and a fourth switch 46. The comparator 41 comprises a first input terminal 42 which is connected to the output terminal of the current sensor 10, a second input terminal 43 and an output terminal 44. The logic gate 45 has the function of an AND-gate and comprises a first input terminal which is connected to the output terminal 44 of the comparator 41 and a second input terminal. The logic gate 45 is designed as an AND-gate. An output terminal of the logic gate 45 is connected to a control terminal of the fourth switch 46. A controlled section of the fourth switch 46, that is the output circuit of the fourth switch 46, couples the output terminal of the protection circuitry 40 and, therefore, a control terminal 4 of the first switch 3 to the reference potential terminal 8.

The first transistor 60 couples the control terminal 4 of the first switch 3 to a second power supply terminal 9. A control terminal of the first transistor 60 is connected to the second terminal 6 of the first switch 3. A first terminal of the controlled section of the first transistor 60 is connected to the power supply terminal 9 and a second terminal of the controlled section is connected to the control terminal 4 of the first switch 3.

The first, the second, the third and the fourth switch 3, 25, 31, 46 and the first transistor 60 are each realized as a MOSFET. The first switch 3 is realized as a N-channel MOSFET.

A load current Iload flows through the current sensor 10 and the first switch 3 to the load 70 and generates a load voltage Vout at the second terminal 2 of the switch arrangement. A current signal SIL with information about the load current Iload is provided by the current sensor 10 to the second input terminal 23 of the OTA 21 of the first control circuitry 20 and to the first input terminal 42 of the comparator 41 of the protection circuitry 40.

A first threshold signal TH1 is applied to the first input terminal 22 of the OTA 21. A second mode signal SM2 is provided to a control terminal of the second switch 25. The first control circuitry 20 provides a first signal S1 at the output terminal of the first control circuitry 20, wherein the first signal S1 depends on the load current signal SIL and the second mode signal SM2.

A first mode signal SM1 is provided to a control terminal of the third switch 31. The current sink 32 provides a current IOFF. The second control circuitry 30 provides a second signal S2 at the output terminal of the second control circuitry 30 which is equal to the current sink current IOFF in the case that the third switch 31 is in a closed position. If the third switch 31 is in an open position, the output terminal of the second control circuitry 30 is in a high impedance state.

A second threshold signal TH2 is applied to the second input terminal 43 of the comparator 41. A third mode signal SM3 is provided to an input terminal of the logic gate 45. The protection circuitry 40 provides a third signal S3 at the output terminal of the protection circuitry 40, wherein the third signal S3 depends on the load current signal SIL and the third mode signal SM3. The first mode signal SM1 is the inverted signal of the second and the third mode signals SM2, SM3 which are equal.

It is an advantage of the first control circuitry 20 comprising an OTA 21 that the first switch 3 can not only be operated in an on-state or an off-state, but can also be operated in an intermediate-state. The first switch 3 has the functionality of a controlled resistor in the intermediate-state.

Figure 2:
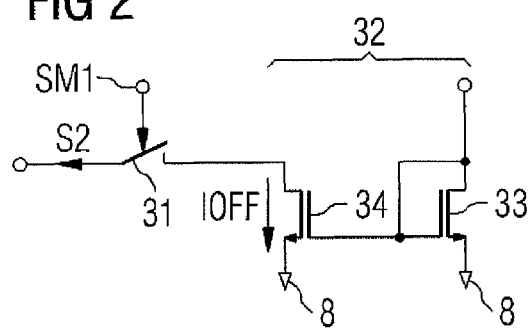
FIG. 2 shows an exemplary embodiment of a second control circuitry.

Other embodiments which can replace the embodiments shown in the FIGS. 1, 2 and 3 are common for a person skilled in the art.

For example, in an alternative embodiment, the first control circuitry 20 comprises a comparator or a differential amplifier instead of the OTA 21.

In an alternative embodiment, the logic gate 45 of the protection circuitry 40 is realized as a NAND-Gate which is coupled to the fourth switch 46 via an inverter.

In another embodiment, the logic gate 45 of the protection circuitry 40 is realized as a NOR-Gate to which an alternative third mode signal SM3 is provided which is the first mode signal SM1 according to this embodiment. In this embodiment, the output of the current sensor 10 is coupled to the second input terminal 43 of the comparator 41 and the second threshold signal TH2 is provided to the first input terminal 42 of the comparator 41.

FIG. 2 shows an exemplary embodiment of the second control circuitry 30, comprising the current sink 32 and the third switch 31. The current sink 32 is realized as a current mirror and comprises a second transistor 33 and a third transistor 34. A first terminal of the second transistor 33 and a first terminal of the third transistor 34 are connected to the reference potential terminal 8. A second terminal of the second transistor 33 is coupled to a control terminal of the second transistor 33 and to a control terminal of the third transistor 34. A second terminal of the third transistor 34 is coupled to the third switch 31 which is coupled to the output terminal of the second control circuitry 30. When the third switch 31 is closed, the current sink current IOFF flows through the third transistor 34.

FIG. 3 shows an exemplary embodiment of the signals in the switch arrangement according to FIG. 1. The function of the parts of the switch arrangement and the signals are described in detail using FIG. 3. FIG. 3 shows the load voltage Vout and the load current Iload. FIG. 3 also shows a gate voltage Vgate which is the voltage at the control terminal 4 of the first switch 3 and a gate source voltage Vgs which is the voltage between the control terminal 4 of the first switch 3 and the second terminal 6 of the first switch 3. Because the first switch 3 is a N-channel MOSFET according to the switch arrangement shown in FIG. 1, the first terminal 5 of the first switch 3 is a drain terminal and the second terminal 6 of the first switch 3 is a source terminal of the field-effect transistor.

FIG. 3 also shows the second mode signal SM2 which is equal to the third mode signal SM3. The second mode signal SM2 is an inverted signal to the first mode signal SM1. FIG. 3 further shows a comparator output signal COUT which is provided by the output terminal 44 of the comparator 41. The different signals are shown versus a time t.

In a first state ST1, the second and the third mode signals SM2, SM3 are in a low-state. Therefore, the second and the fourth switches 25, 46 are in an open state and the output terminals of the first control circuitry 20 and of the protection circuitry 40 are in a high-impedance state. The first mode signal SM1 is in a high-state and, therefore, the current sink current IOFF discharges the capacitance of the control terminal 4 of the first switch 3. The gate voltage Vgate at the control terminal 4 of the first switch 3 obtains a low value, so that the first switch 3 is in an off-state. The gate voltage Vgate obtains the minimum value which can be achieved by the current sink 32. The minimum value of the gate voltage Vgate is, therefore, limited by the minimum of the supply potentials which are applied to the current sink 32.

In a second state ST2, the second and the third mode signals SM2, SM3 obtain a high-state and the first mode signal SM1 obtains a low-state. Because the load current Iload is smaller than the second threshold signal TH2, the output terminal of the protection circuit 40 is in a high-impedance state. Because the load current Iload is lower than the first threshold signal TH1, the operational transconductance amplifier 21 provides a positive current at its output terminal 24 which yields a first signal S1 with a positive current value. Therefore, the gate voltage Vgate at the control terminal 4 of the first switch 3 increases. The gate voltage Vgate achieves a maximum value which depends on the maximum value of a voltage which can be provided by the output terminal 24 of the operational transconductance amplifier 21. The voltage at the output terminal 24 of the OTA 21 is limited by the maximum of the supply potentials of the operational transconductance amplifier 21.

FIG. 3 shows that the rise of the gate voltage Vgate is performed with a first time constant $\tau 1$. The first time constant $\tau 1$ depends on the capacitance of the control terminal 4 of the first switch 3 and the current value of the first signal S1 which is provided by the operational transconductance amplifier 21. The first time constant $\tau 1$ depends on a product of the gate capacitance and of the current value of the first signal S1. The switch arrangement, therefore, shows a soft start characteristic. Because of the soft start characteristic a load 70 with a high capacitance 72 can be connected to the second terminal 2 and a high in-rush current is avoided. This is provided by the slow change of the resistance of the controlled section of the first switch 3 from an off-state with a high resistance to an on-state with a low resistance. A current limitation is not triggered because of this soft start.

In a third state ST3, the second mode signal SM2 is in a high-state. The load current Iload is greater than the first threshold signal TH1 and the load current Iload is smaller than the second threshold signal TH2. Therefore, the signal at the first input terminal 22 of the operational transconductance amplifier 21 is smaller than the signal at the second input terminal 23 of the operational transconductance amplifier 21. The first signal S1, therefore, is a current with a negative sign which discharges the control terminal 4 of the first switch 3. The gate voltage Vgate is reduced so that the load current Iload is equivalent to the first threshold signal TH1.

In a fourth state ST4, the second and the third mode signal SM2, SM3 are in a high-state. The load current Iload obtains a value which is greater than the first threshold signal TH1 and also greater than the second threshold signal TH2. This can for example be caused by a sudden short circuit in the load 70. The comparator output signal COUT at the output terminal 44 of the comparator 41 will be changed from a low-state to a high-state. The logic gate 45 which is realized as an AND-gate provides a high-state at the output terminal of the logic gate 45 and, therefore, a high-state at the control terminal of the fourth switch 46. Therefore, the controlled section of the fourth switch 46 will be very rapidly switched into a low resistance state, so that the control terminal 4 of the first switch 3 is very quickly discharged. The gate voltage Vgate drops to a value so that the first switch 3 is in an off-state. When the load current Iload obtains a small value, the output terminal of the protection circuitry 40 will be again in a high-impedance state. The switch arrangement will start with the soft start characteristics and the control terminal 4 of the first switch 3 will be charged by the first signal S1 provided by the first control circuitry 20 with the first time constant $\tau 1$.

In a fifth state ST5, a transition from a low-state of the second mode signal SM2 to a high-state is shown. FIG. 3 shows an increase of the load current Iload and of the output voltage Vout with the first time constant $\tau 1$ of the soft start characteristic described above.

In a sixth state ST6, a transition of the second mode signal SM2 from a high-state to a low-state is shown. The voltage Vgate applied to the control terminal 4 of the first switch 3 will be reduced by the second signal S2, so that the discharging procedure is performed. This is done by realizing a second time constant $\tau 2$. In an embodiment, the current sink 32 is realized as a resistor. In this embodiment, the second time constant $\tau 2$ depends on the product of the gate capacitance and the value of the resistor. Alternatively, the discharging can be implemented by using a constant current sink current IOFF, provided by the embodiment of the current sink 32 shown in FIG. 2. Therefore, the switch-off procedure is also controlled and is relatively slow.

The function of the first transistor 60 is to protect the first switch 3 in case that the first switch 3 has a maximum allowed gate source voltage Vgs between the control terminal 4 and the second terminal 6 of the first switch 3 which is lower than the maximum of the supply voltages. In this case, the first transistor 60 will be switched on for a reduction of the gate voltage Vgate and ensures that the gate source voltage Vgs does not exceed the allowed value for the gate source voltage.

It is an advantage of the switch arrangement according to FIG. 1 that it shows a current limitation capability, a short circuit current protection, a soft start characteristic and a soft recovery after a short circuit event. The time constants $\tau 1$, $\tau 2$ for the soft start characteristic and for the switch-off characteristic can be controlled independently by the design of the operational transconductance amplifier 21 in the case of the soft start characteristics and by the design of the current sink 32 in case of the switch-off characteristic.

The scope of protection of the invention is not limited to the examples given hereinabove. The invention is embodied in each novel characteristic and each combination of characteristics, which includes every combination of any features which are stated in the claims, even if this feature or combination of features is not explicitly stated in the examples.

The invention claimed is:
1. A switch arrangement, comprising:
a first and a second terminal;
a first switch comprising:
   a control terminal,
   a first terminal which is coupled to the first terminal of the switch arrangement, and
   a second terminal which is coupled to the second terminal of the switch arrangement;
a current sensor for the measurement of a load current flowing through the first switch;
a first control circuitry which is coupled to an output terminal of the current sensor and to the control terminal of the first switch for providing a first signal to the control terminal of the first switch for current limitation of the load current by a first threshold signal, the first control circuitry comprises:
   an operational transconductance amplifier having:
      a first input terminal which receives the first threshold signal;
      a second input terminal which is coupled to the output terminal of the current sensor; and
      an output terminal which is coupled to the control terminal of the first switch;
a second control circuitry which is coupled to the control terminal of the first switch for providing a second signal to the control terminal of the first switch, wherein the second signal depends on a first mode signal; and
a protection circuitry against short circuit which is connected to the output terminal of the current sensor and couples the control terminal of the first switch to a reference potential terminal, the protection circuitry comprises:
   a comparator having:
      a first input terminal which is coupled to the output terminal of the current sensor;
      a second input terminal which receives a second threshold signal; and
      an output terminal; and
   a fourth switch having:
      a first terminal which is coupled to the control terminal of the first switch;
      a second terminal which is coupled to the reference potential terminal; and
      a control terminal which is coupled to the output terminal of the comparator, the protection circuitry comprises a logic gate having
         a first input terminal which is coupled to the output terminal of the comparator,
         a second input terminal which receives a third mode signal, and
         an output terminal which is coupled to the control terminal of the fourth switch,
wherein a second mode signal and the third mode signal are equal signals, and the first mode signal is an inverted signal of the second mode signal, and wherein the logic gate has a function equivalent to an AND-gate.
2. The switch arrangement according to claim 1, wherein the first control circuitry and the second control circuitry are each realized as a current source.
3. The switch arrangement according to claim 1, wherein the first control circuitry comprises a second switch having a control terminal which receives a second mode signal,
a first terminal which is coupled to the output terminal of the operational transconductance amplifier, and
a second terminal which is coupled to the control terminal of the first switch.

4. The switch arrangement according to claim 1, wherein the second control circuitry comprises a current sink, and a third switch, wherein the third switch comprises
a control terminal which receives a first mode signal,
a first terminal which is coupled to the reference potential terminal via the current sink, and
a second terminal which is coupled to the control terminal of the first switch.

5. The switch arrangement according to claim 4, wherein the current sink is realized as a current mirror.

6. The switch arrangement according to claim 1, wherein the switch arrangement comprises a first transistor having
a first terminal which is coupled to the control terminal of the first switch,
a second terminal which is coupled to a supply voltage terminal, and
a control terminal which is coupled to the second terminal of the first switch.

7. The switch arrangement according to claim 1, wherein the first switch is realized as a metal-oxide-semiconductor field-effect transistor.

8. The arrangement according to claim 1, comprising a load which is coupled to the second terminal of the switch arrangement.

9. A method for electrical switching, comprising controlling a first switch with the steps of:
coupling the first switch via a first transistor to a power supply terminal, wherein a control terminal of the first transistor is connected to a terminal of the first switch;
providing a first signal to a control terminal of the first switch depending on a load current which flows through the first switch and through a current sensor, wherein the first signal is provided by a first control circuit in such a way that the load current is smaller or is equal to a first threshold signal;
providing a second signal to the control terminal of the first switch depending on a first mode signal; and
providing a third signal by a protection circuit that couples the control terminal of the first switch to a reference potential terminal for protection against short circuit to the control terminal of the first switch depending on the load current and a second threshold signal,
wherein an output of the current sensor is connected to the first control circuit and to the protection circuit.

10. The method according to claim 9, wherein the second signal is a current having only one sign and wherein the first signal is a current having a sign depending whether the load current has a greater or a smaller value in comparison to the first threshold signal.

11. A switch arrangement, comprising:
a first and a second terminal;
a first switch comprising:
a control terminal,
a first terminal which is coupled to the first terminal of the switch arrangement, and
a second terminal which is coupled to the second terminal of the switch arrangement;
a current sensor for the measurement of a load current flowing through the first switch;
a first control circuitry which is coupled to an output terminal of the current sensor and to the control terminal of the first switch for providing a first signal to the control terminal of the first switch for current limitation of the load current by a first threshold signal;
a second control circuitry which is coupled to the control terminal of the first switch for providing a second signal to the control terminal of the first switch, wherein the second signal depends on a first mode signal;
a protection circuitry against short circuit which is connected to the output terminal of the current sensor and couples the control terminal of the first switch to a reference potential terminal; and
a first transistor having:
a first terminal which is coupled to the control terminal of the first switch;
a second terminal which is coupled to a supply voltage terminal; and
a control terminal which is coupled to the second terminal of the first switch.

12. A switch arrangement, comprising:
a first and a second terminal;
a first switch comprising:
a control terminal,
a first terminal which is coupled to the first terminal of the switch arrangement, and
a second terminal which is coupled to the second terminal of the switch arrangement;
a current sensor for the measurement of a load current flowing through the first switch;
a first control circuitry which is coupled to an output terminal of the current sensor and to the control terminal of the first switch for providing a first signal to the control terminal of the first switch for current limitation of the load current by a first threshold signal, the first control circuitry comprises:
an operational transconductance amplifier having:
a first input terminal which receives the first threshold signal;
a second input terminal which is coupled to the output terminal of the current sensor; and
an output terminal which is coupled to the control terminal of the first switch;
a second control circuitry which is coupled to the control terminal of the first switch for providing a second signal to the control terminal of the first switch, wherein the second signal depends on a first mode signal; and
a protection circuitry against short circuit which is connected to the output terminal of the current sensor and couples the control terminal of the first switch to a reference potential terminal, the protection circuitry comprises:
a comparator having:
a first input terminal which is coupled to the output terminal of the current sensor;
a second input terminal which receives a second threshold signal; and an output terminal; and
a fourth switch having:
a first terminal which is coupled to the control terminal of the first switch;
a second terminal which is coupled to the reference potential terminal; and
a control terminal which is coupled to the output terminal of the comparator, the protection circuitry comprises a logic gate having a first input terminal which is coupled to the output terminal of the comparator,
a second input terminal which receives a third mode signal, and
an output terminal which is coupled to the control terminal of the fourth switch,
wherein the first mode signal and the third mode signal are equal signals, and the first mode signal is an inverted signal of a second mode signal, and wherein the logic gate has a function equivalent to a NOR-gate.

* * * * *